United States Patent [19]
Chapman et al.

[11] Patent Number: 6,104,223
[45] Date of Patent: Aug. 15, 2000

[54] CALIBRATABLE PROGRAMMABLE PHASE SHIFTER

[75] Inventors: D. James Chapman, Lake Oswego, Oreg.; Jeffrey D. Currin, Pleasanton, Calif.

[73] Assignee: Credence Systems Corporation, Fremont, Calif.

[21] Appl. No.: 09/016,556

[22] Filed: Jan. 30, 1998

[51] Int. Cl.[7] .................................................. H03H 11/26
[52] U.S. Cl. ............................................. 327/276; 327/284
[58] Field of Search ..................... 327/269–271, 327/272, 276–278, 280, 281, 284, 285, 287, 288, 274

[56] References Cited

U.S. PATENT DOCUMENTS

| | | | |
|---|---|---|---|
| 5,589,788 | 12/1996 | Goto | 327/276 |
| 5,900,762 | 5/1999 | Ramakrishnan | 327/277 |
| 5,963,074 | 10/1999 | Arkin | 327/276 |

*Primary Examiner*—Terry D. Cunningham
*Attorney, Agent, or Firm*—Daniel J. Bedell; Smith-Hill and Bedell

[57] ABSTRACT

A programmable phase shifter includes a tapped delay line for successively delaying a periodic reference signal to produce a set of phase distributed tap signals. A multiplexer selects one of the tap signals as input to a programmable delay circuit which further delays the selected tap signal to produce an output signal that is phase shifted from the reference signal. A programmable data converter converts input data indicting a desired phase shift between the reference signal and the output signal into data for controlling the multiplexer selection and the amount of delay provided by the programmable delay circuit. The relationship between conversion table input and output data is adjusted so that the period of the output signal has a desired linear relationship to the input data value.

4 Claims, 3 Drawing Sheets

CALIBRATABLE PROGRAMMABLE PHASE SHIFTER

BACKGROUND OF THE INVENTION

1. Field of the Invention

The present invention relates in general to a programmable phase shifter for phase shifting a periodic input signal by an adjustable amount, and in particular to a programmable phase shifter that can be easily calibrated to provide a phase shift that is a linear function of the value of input control data.

2. Description of Related Art

FIG. 1 illustrates a prior art programmable phase shifter 10 for phase shifting a periodic input signal $T_0$ by an adjustable phase angle to produce an output signal $T_{OUT}$. The phase angle is controlled by 10-bit input control data N. Ideally phase shifter 10 should provide a phase shift between $T_0$ and $T_{OUT}$ that is a linear function of the value of input control data N. However, as explained below, phase shifter 10 has inherent sources of error that cause the phase shift to deviate from the desired linear function of the value of N.

Phase shifter 10 includes a tapped delay line 12 formed by a set of delay elements 14 connected in series for successively delaying the $T_0$ signal to produce a set of 32 "tap" signals $TAP_1$–$TAP_{32}$ at the element outputs. A delay element 14 may be, for example, a logic gate. Each successive tap signal $TAP_1$–$TAP_{32}$ is inverted and delayed from its preceding tap signal by the inherent delay of a delay element 14. The $T_0$ and $TAP_{32}$ signals provide inputs to a conventional delay lock loop (DLL) controller 16 providing a BIAS signal to each delay element 14. The BIAS signal controls the switching speed of the delay elements and therefore controls the delay of each delay element 14. DLL controller 16 adjusts the BIAS signal so that the $TAP_{32}$ signal is phase locked to the $T_o$ signal. Thus the total delay between $T_0$ and $TAP_{32}$ is equal to the period $P_0$ of $T_0$. When all delay elements 14 are similar, each element's delay is close to the average element delay of $P_0/32$.

The tap signals $TAP_1$–$TAP_{32}$ are inputs to a multiplexer 18 controlled by the upper five bits NH of 10-bit input control data N. Multiplexer 18 selects one of its input signals $TAP_1$–$TAP_{32}$ and provides it as an input signal $T_S$ to a programmable delay circuit 20. Delay circuit 20 delays the $T_S$ signal by from 0 to 31 "unit delays" where a unit delay is $P_0/(32*N_{MAX})$. The amount of the delay provided by delay circuit 20 is selected by the lower 5 bits NL of control data N. Thus the 10-bit input control data N controls the phase shift between $T_0$ and $T_{OUT}$ with a resolution of $P_0/2^{10}$.

FIG. 2 illustrates a typical prior art programmable delay circuit 20 in more detailed block diagram form. Delay circuit 20 includes a set of $2^5$ delay elements 22, each delay element 22 delaying the $T_S$ signal to provide a separate input to a multiplexer 26 controlled by the five NL bits. The delay provided by each delay element 24 is controlled by the size of a capacitor 24 within the delay element.

While the resolution of phase shifter 10 of FIG. 1 is nominally $P_0/2^{10}$, differences in the delays provided by delay elements 14 affect the accuracy of the phase shift it provides. One major source of error is power supply noise. In synchronous circuits using $T_0$ as the primarily reference clock for synchronous operations, the largest component of power supply noise typically comes from the $T_0$ signal. The power supply noise is therefore coherent with the $T_0$ signal. The delay of each delay element 14 changes with its power supply voltage. Thus the delay of each delay element 14 varies over time, but does so periodically in a manner that is synchronized to the movement of $T_0$ pulses through delay line 12. When a $T_0$ pulse is passing through any particular delay element 14, the power supply voltage provided to that delay element 14 is the same as it is when any other $T_0$ pulse passes through that same delay element 14. Thus despite the presence of power supply noise, any particular delay element 14 delays each successive $T_0$ pulse by the same amount. However since each delay element 14 carries out its delay operation at a different time relative to a $T_0$ clock cycle, and since the power supply varies during each $T_0$ clock cycle, each delay element 14 receives a different power supply voltage at the time it is actually delaying the $T_0$ pulse. Thus the coherent noise in the power supply makes each delay element 14 provide a different delay. Due to the variation in delays of delay elements 14, the phase shift between $T_0$ and $T_{OUT}$ provided by phase shifter 10 is a non-linear function of its the input control data N.

What is needed is a phase shifter employing a tapped delay line in which the phase shift it provides is a linear function of input data N despite variation in delay provided by the delay line stages.

SUMMARY OF THE INVENTION

A programmable phase shifter in accordance with the present invention phase shifts a periodic input signal $T_0$ having a period $P_0$ to produce an output signal $T_{OUT}$. The phase shifter includes a tapped delay line formed by a set of L similar delay elements connected in series for successively delaying the $T_0$ signal to produce a set of L output tap signals $TAP_1$–$TAP_L$. The delay elements have delays averaging $P_0/L$ so that $TAP_L$ is phase locked to $T_0$ and so that tap signals $TAP_1$–$TAP_L$ are distributed in phase by steps averaging $P_0/L$. A multiplexer selects one of the tap signals and delivers it as an input signal $T_S$ to a programmable delay circuit. The programmable delay circuit delays the $T_S$ signal by an adjustable amount ranging from 0–$P_0/L$ plus a small inherent delay to produce the output signal $T_{OUT}$.

In accordance with one aspect of the invention, a programmable data converter converts an input data word N indicating a desired phase shift into control data (F,G). The multiplexer's tap selection is controlled by a first portion F of control data (F,G) while the delay of programmable delay circuit is controlled by a second portion G of control data (F,G). The data converter is programmed by input function control data to provide a relationship between the value of output control data (F,G) and input control data N that causes the phase shift between $T_0$ and $T_{OUT}$ to be a substantially linear function of the value of N despite variations in the delay provided by delay elements of the tapped delay line.

It is accordingly an object of the invention to provide an apparatus for phase shifting a periodic input signal wherein the amount of the phase shift is a linear function of an input data value.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

DESCRIPTION OF THE PREFERRED EMBODIMENT(S)

Figure 1:
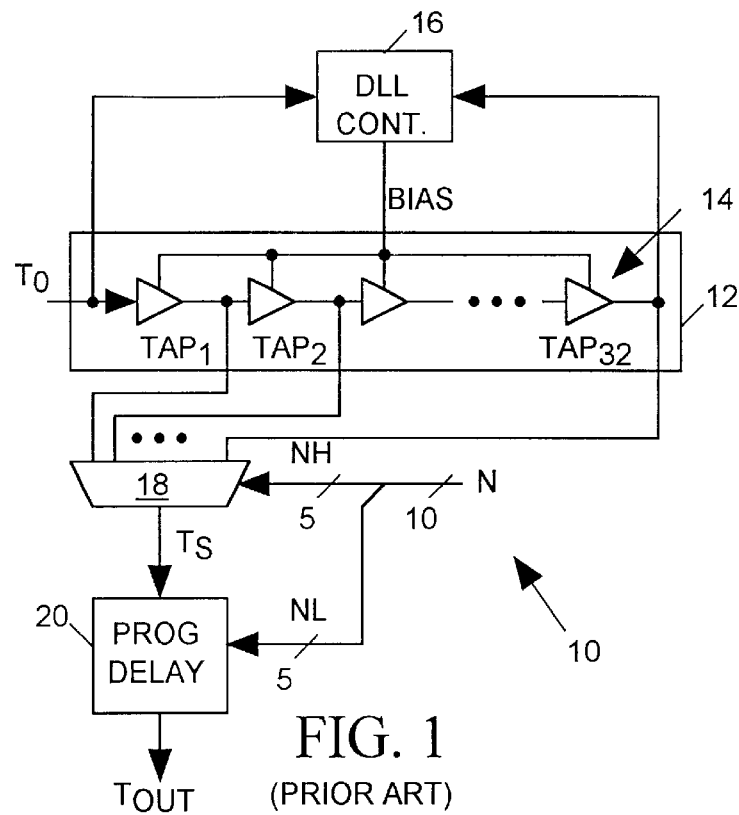
FIG. 1 illustrates prior art programmable phase shifter in block diagram form.
Figure 3:
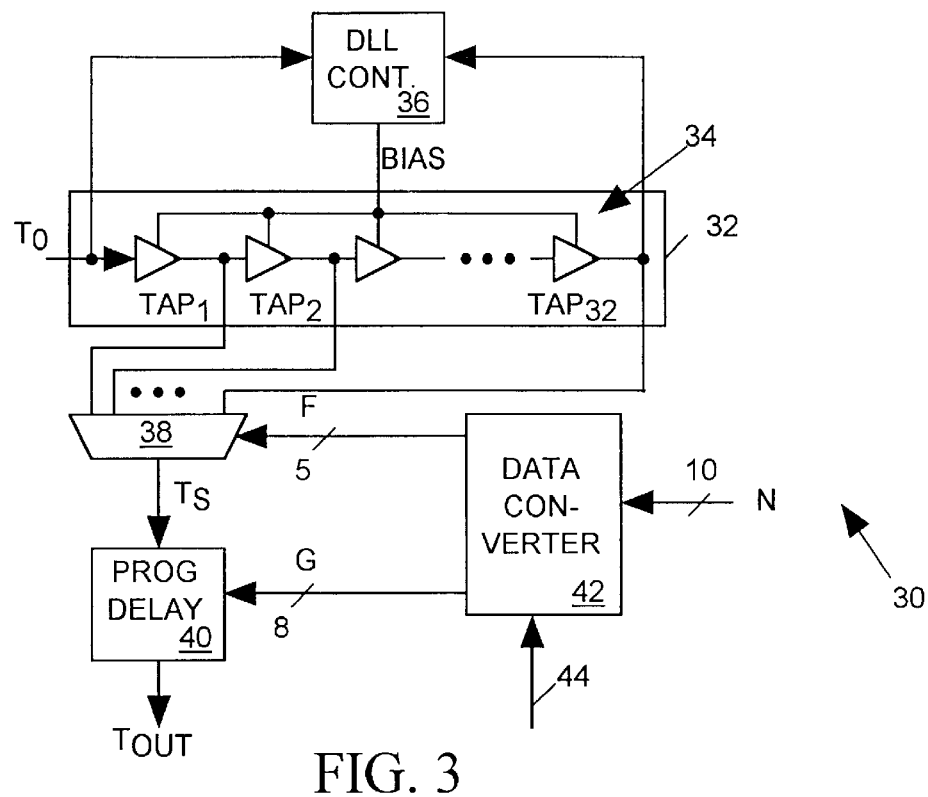
FIG. 3 illustrates in block diagram form improved programmable phase shifter in accordance with the present invention.

FIG. 3 illustrates a phase shifter 30 in accordance with the present invention that is an improved version of prior art phase shifter 10 of FIG. 1. Phase shifter 30 provides a phase shift between an input signal $T_0$ and an output signal $T_{OUT}$ of $(N/N_{MAX})P_0$ where $P_0$ is the period of the $T_0$ signal, N is the value of input control data N, and $N_{MAX}$ is the maximum value of N. Since in the example of FIG. 3 N is a 10-bit number, NMAX may be as large as $2^{10}-1$.

Phase shifter 30 includes a tapped delay line 32 formed by a set of delay elements 34 connected in series for successively delaying the $T_0$ signal to produce a set of L "tap" signals $TAP_1-T_L$ at the element outputs. L may be any value larger than 1 and is determined by the number of delay elements forming delay line 12. In the example illustrated in FIG. 3, L is 32. Each successive tap signal $TAP_1-TAP_{32}$ is delayed from its preceding tap signal by the inherent delay of a delay element 34. The $T_0$ and $TAP_{32}$ signals are applied as inputs to a conventional delay lock loop (DLL) controller 36 that provides a BIAS signal to each delay element 34. The BIAS signal controls the inherent delay of each delay element 34. DLL controller 36 adjusts the BIAS signal so that the $TAP_{32}$ signal is phase locked to the $T_0$ signal. Thus the total delay between $T_0$ and $TAP_{32}$ is equal to the period $P_0$ of $T_0$. Since all delay elements 34 are similar, each element's delay is close to the average delay of $P_0/32$. However there will be some variation in delay due to process or environmental differences between the delay elements, and due to noise in the BIAS signal that is coherent with $T_0$.

Figure 2:
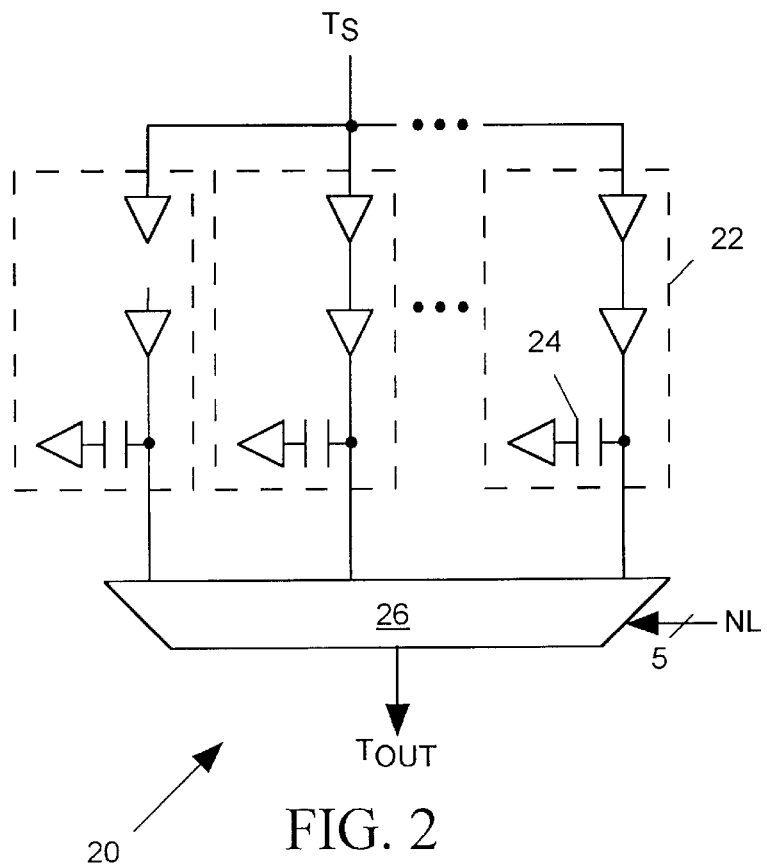
FIG. 2 illustrates a prior art programmable delay circuit suitable for use in the programmable phase shifter of FIG. 1.

The tap signals $TAP_1-TAP_{32}$ provide inputs to a multiplexer 38 controlled by the upper five bits F of an 13-bit control data value (F,G). Multiplexer 38 selects one of its input signals $TAP_1-TAP_{32}$ and provides it as an input signal $T_S$ to a programmable delay circuit 40, suitably similar to delay circuit 20 of FIG. 2 but having $2^8$ delay elements instead of $2^5$ delay elements. Delay circuit 40 delays the $T_S$ signal by from 0 to $2^8$ "unit delays" where a unit delay is $P_0/(L*N_{MAX})$. The amount of the delay provided by delay circuit 40 is selected by the lower eight bits G of control data (F,G). Thus the 13-bit data value (F,G) controls the phase shift between $T_0$ and $T_{OUT}$ with a resolution of $P_0/(L*N_{MAX})$ A programmable data converter 42 receives input data N and converts it to the 13-bit delay control data (F,G). The value of control data (F,G) is a function of the value of N and that function may be adjusted by input function control data provided to data converter 42 from an external source through a conventional computer bus 44. Phase shifter 30 can be calibrated to provide a phase shift between $T_0$ and $T_{OUT}$ that is a substantially linear function of N by appropriately adjusting the relationship between the value of output control data (F,G) data converter 42 produces and its input control data N. The calibration may be performed by using an oscilloscope to monitor $T_0$ and $T_{OUT}$ while adjusting the function control data provided to data converter 42 so that the output (F,G) it produces causes phase shifter 30 to provide an appropriate phase shift between $T_0$ and $T_{OUT}$ for each value of N.

Figure 4:
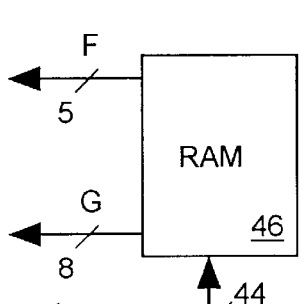
FIG. 4 illustrates a first embodiment of the phase shifter of FIG. 3 in block diagram form.

FIG. 4 illustrates a first embodiment of data converter 42 of FIG. 3, a random access memory (RAM) 46 addressed by input data N and reading out F and G. During calibration, a value of (F,G) for each value of input N is written into address N of RAM 46 via bus 44. The phase shift provided for each value of N is then measured and the value of the (F,G) data stored in the corresponding RAM 46 address N is incrementally increased or decreased depending on whether the measured phase shift is too small or too large. The process is repeated until a value of (F,G) providing the closest approximation of a linear relationship between the value of N and phase shift is stored at each RAM 46 address.

Figure 5:
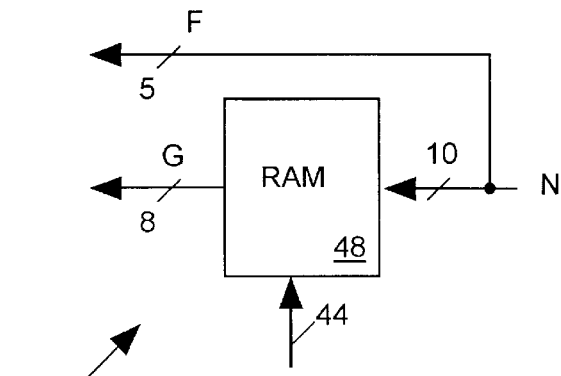
FIG. 5 illustrates a second embodiment of the phase shifter of FIG. 3 in block diagram form.

The embodiment of data converter 42 illustrated in FIG. 4 allows complete freedom in choosing a tap signal and a programmable delay for each value of N. However since RAM 46 must provide $2^{10}$ M-bit storage locations, RAM 46 must be very large. FIG. 5 illustrates a second embodiment of data converter 42 of FIG. 3 in which the upper five bits of the 10-bit input data N directly provide the five F bits controlling multiplexer 38 of FIG. 3 while a RAM 48 addressed by the 10-bit N data provides only the 8-bit control data input G to programmable delay circuit 40. RAM 48 of FIG. 5, while still requiring $2^{10}$ storage locations, is none the less smaller than RAM 46 of FIG. 4 because it stores only eighth bits instead of thirteen bits at each storage location. Although the embodiment of FIG. 5 does not allow for adjustment of tap selection for each value of N, when the variation in delay provided by each delay element 34 is small enough, it is not necessary for tap selection to be an adjustable function of N.

Figure 6:
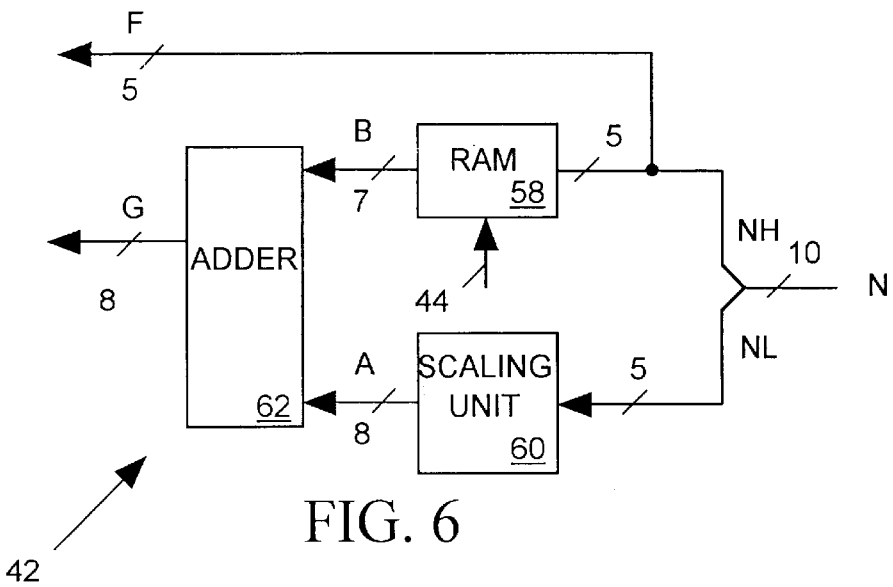
FIG. 6 illustrates a third embodiment of the phase shifter of FIG. 3 in block diagram form.

FIG. 6 illustrates a third embodiment of data converter 42 of FIG. 3 in which the upper five bits NH of the 10-bit input data N directly provide the 5-bit F data value controlling multiplexer 38 of FIG. 3 and also address a RAM 58 write accessed by bus 44. RAM 58 stores and reads out 7-bit "delay correction" data B when addressed by the NH bits. A scaling unit 60 converts the lower five bits NL of the input N data to 8-bit delay control data A. An adder 62 sums the delay control data A with the delay correction data B to produce the 8-bit control data G provided to programmable delay circuit 40 of FIG. 3.

The value of the five NL bits can range from 0 to $2^5-1$ and the value of seven delay correction data B can range from 0 to $2^7-1$. Scaling unit 60, which may be implemented for example by dedicated logic or a ROM, suitably provides the relation $$A=(2^8-2^7)NL/(2^5-1)$$

Thus the value of A can range from 0 to $2^8-2^7$ and the value of G can range from 0 to $2^8-1$. When the tap signal selected by F=NH has no delay error, the value of B read out of RAM 58 has a midpoint value $2^6$. Thus the delay provided by programmable delay circuit 70 is determined by G=A+B=A+$2^6$. When the tap signal selected by F=NH is excessively delayed from the $T_0$ signal, the value of B read of RAM 58 can be made appropriately smaller than its midpoint value $2^6$ so as to decrease the delay provided by programmable delay circuit 20. When the selected tap signal is insufficiently delayed from $T_0$, the value of B read of RAM 58 can be made appropriately larger than its midpoint value $2^6$ so as to provide a compensating increase in the signal delay through programmable delay circuit 20. Though somewhat more complicated than the embodiments of FIGS. 4 and 5, the embodiment of data converter 42 of FIG. 6 requires a RAM requiring only $2^5$ storage locations instead of the $2^{10}$ storage locations required by RAMs 46 and 48 of the embodiments of FIGS. 4 and 5.

Figure 7:
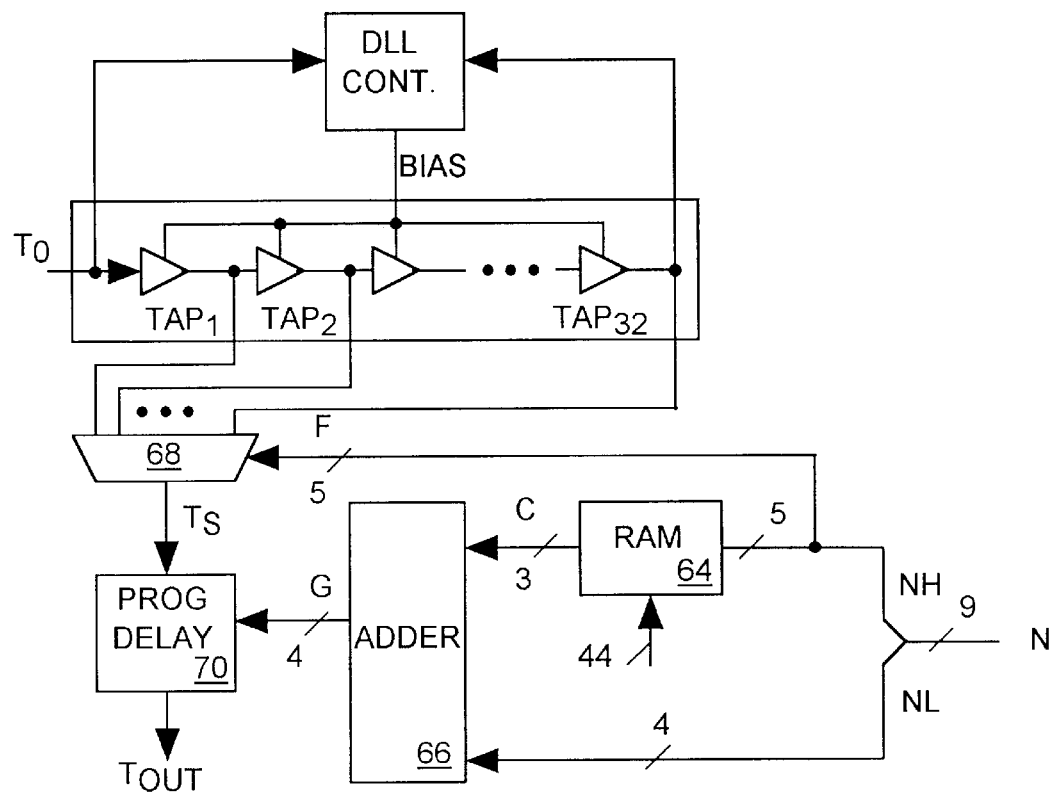
FIG. 7 illustrates an alternative embodiment of the programmable phase shifter of FIG. 3.

FIG. 7 illustrates a programmable phase shifter 62 in accordance with the present invention employing a data converter consisting of only a small RAM 64 and an adder 66. In this embodiment of the invention the input control data N has only nine bits. A multiplexer 68 chooses from among $2^5$ tap signals in response to control data F directly provided by the upper five bits NH of input control data N. A programmable delay circuit 70 delays the $T_S$ output of multiplexer 68 with 4-bit resolution. Although the lower four bits NL of input control data could represent any number from 0 through 15, the range of NL is restricted to values from zero through nine (0–9). Accordingly N has a total of $10(2^5)$ permissible values while phase shifter 62 can provide a total of $2^9$ discrete delays.

RAM 64, addressed by the five NH bits produces 3-bit delay correction data C. The permissible value of C is restricted to a range of 0–6. Adder 66 adds the delay correction data C to the four lower bits NL of input data N to produce the 4-bit control data G provided to delay circuit 70. Thus G=NL+C may have any value from 0–15. The data stored in RAM 64 is adjusted during calibration so that when a tap signal selected by any particular value of F has no delay error, RAM 64 produces an output delay correction value of C=3. When a tap signal selected by a value of F is excessively delayed from $T_0$, RAM 64 produces an output delay correction value C that is less than 3 by an amount depending on the size of the delay in the tap signal. When a tap signal selected by a value of F is insufficiently delayed from $T_0$, RAM 64 produces an output delay correction data C value that is sufficiently greater than 3 to compensate for insufficient delay of the selected tap signal.

Thus has been shown and described a programmable phase shifter in accordance with the present invention. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for phase shifting a periodic reference signal $T_0$ to produce an output signal $T_{OUT}$ with a phase shift that is a function of a value of input first control data N, wherein said function is adjustably determined by input function control data, the apparatus comprising:
 a programmable phase shifter for phase shifting said periodic reference signal $T_0$ with a phase shift controlled by a value of second control data (F,G) provided as input thereto, thereby to produce $T_{OUT}$; and
 a programmable data converter, receiving said first control data N and said function control data, for providing said second control data (F,G) to said programmable phase shifter, wherein a value of said second control data (F,G) is an adjustable function of said value of said first control data N, said function being adjusted in accordance with said function control data,
 wherein said programmable phase shifter comprises:
  a tapped delay line for receiving and delaying said periodic reference signal $T_0$ to produce a plurality of tap signals TAP each delayed from $T_0$ by a differing amount,
  a multiplexer for receiving said tap signals TAP, selecting in response to a first portion F of said second control data (F,G) one of said TAP signals and providing it as an output selected tap signal $T_S$, and
  a programmable delay circuit for receiving and delaying said selected tap signal $T_S$ with a delay time determined by a second portion G of said second control data (F,G) to produce said output signal $T_{OUT}$,
 wherein said programmable data converter comprises:
  a random access memory addressed by a first portion NH of said first control data N for storing delay correction data B and for reading out stored delay correction data B when addressed by said first portion NH of said first control data N,
  means for delivering said first portion NH of said first control data N to said multiplexer as said first portion F of said second control data (F,G),
  scaling means for receiving a second portion NL of said first control data N and for producing output delay control data wherein said delay control data A is proportionately larger than said second portion NL of said first control data N, and
  an adder for adding said delay control data A produced by said scaling means to delay correction data B read out of said random access memory to produce said second portion G of said second control data (F,G).

2. An apparatus for phase shifting a periodic reference signal $T_0$ to produce an output signal $T_{OUT}$ with a phase shift that is a function of a value of input first control data N, wherein said function is adjustably determined by input function control data, the apparatus comprising:
 a programmable phase shifter for phase shifting said periodic reference signal $T_0$ with a phase shift controlled by a value of second control data (F,G) provided as input thereto, thereby to produce $T_{OUT}$; and
 a programmable data converter, receiving said first control data N and said function control data, for providing said second control data (F,G) to said programmable phase shifter, wherein a value of said second control data (F,G) is an adjustable function of said value of said first control data N, said function being adjusted in accordance with said function control data,
 wherein said programmable phase shifter comprises:
  a tapped delay line for receiving and delaying said periodic reference signal $T_0$ to produce a plurality of tap signals TAP each delayed from $T_0$ by a differing amount,
  a multiplexer for receiving said tap signals TAP, selecting in response to a first portion F of said second control data (F,G) one of said TAP signals and providing it as an output selected tap signal $T_S$, and
  a programmable delay circuit for receiving and delaying said selected tap signal $T_S$ with a delay time determined by a second portion G of said second control data (F,G) to produce said output signal $T_{OUT}$; and
 wherein said programmable data converter comprises:
  a random access memory addressed by a first portion NH of said first control data N for storing delay correction data C and for reading out stored delay correction data C addressed by said first portion NH of said first control data N, means for delivering said first portion NH of said first control data N to said multiplexer as said first portion F of said second control data (F,G), and an adder for adding a second portion NL of said first control data N to said delay correction data C read out of said random access memory thereby producing said second portion G of said second control data (F,G).

3. An apparatus for phase shifting a periodic reference signal $T_0$ to produce an output signal $T_{OUT}$ with a phase shift that is a function of a value of input first control data N, wherein said function is adjustably determined by input function control data, the apparatus comprising:

a programmable phase shifter for phase shifting said periodic reference signal $T_0$ with a phase shift controlled by a value of second control data (F,G) provided as input thereto, thereby to produce $T_{OUT}$; and a programmable data converter, receiving said first control data N and said function control data, for providing said second control data (F,G) to said programmable phase shifter, wherein a value of said second control data (F,G) is an adjustable function of said value of said first control data N, said function being adjusted in accordance with said function control data, wherein said programmable data converter comprises:

a random access memory addressed by a first portion NH of said first control data N for storing delay correction data B and for reading out stored delay correction data B when addressed by said first portion NH of said first control data N, means for delivering said first portion NH of said first control data N to said multiplexer as said first portion F of said second control data (F,G), scaling means for receiving a second portion NL of said first control data N and for producing output delay control data A wherein said delay control data A is proportionately larger than said second portion NL of said first control data N, and an adder for adding said delay control data A produced by said scaling means to delay correction data B read out of said random access memory to produce said second portion G of said second control data (F,G).

4. An apparatus for phase shifting a periodic reference signal $T_0$ to produce an output signal $T_{OUT}$ with a phase shift that is a function of a value of input first control data N, wherein said function is adjustably determined by input function control data, the apparatus comprising:

a programmable phase shifter for phase shifting said periodic reference signal $T_0$ with a phase shift controlled by a value of second control data (F,G) provided as input thereto, thereby to produce $T_{OUT}$; and a programmable data converter, receiving said first control data N and said function control data, for providing said second control data (F,G) to said programmable phase shifter, wherein a value of said second control data (F,G) is an adjustable function of said value of said first control data N, said function being adjusted in accordance with said function control data, and wherein said programmable data converter comprises:

a random access memory addressed by a first portion NH of said first control data N for storing delay correction data C and for reading out stored delay correction data C addressed by said first portion NH of said first control data N, means for delivering said first portion NH of said first control data N to said multiplexer as said first portion F of said second control data (F,G), and an adder for adding a second portion NL of said first control data N to said delay correction data C read out of said random access memory thereby producing said second portion G of said second control data (F,G).

* * * * *